United States Patent
Farassat

(10) Patent No.: US 7,735,711 B2
(45) Date of Patent: Jun. 15, 2010

(54) METHOD OF TESTING BONDED CONNECTIONS, AND A WIRE BONDER

(75) Inventor: Farhad Farassat, Taufkirchen (DE)

(73) Assignee: F & K Delvotec Bondtechnik GmbH, Ottobrunn (DE)

( * ) Notice: Subject to any disclaimer, the term of this patent is extended or adjusted under 35 U.S.C. 154(b) by 27 days.

(21) Appl. No.: 11/945,189

(22) Filed: Nov. 26, 2007

(65) Prior Publication Data

US 2008/0073410 A1    Mar. 27, 2008

Related U.S. Application Data

(63) Continuation of application No. 10/090,083, filed on Mar. 1, 2002, now abandoned.

(30) Foreign Application Priority Data

Nov. 7, 2001    (EP) .................................. 01126621

(51) Int. Cl.
B23K 31/02    (2006.01)
B23K 37/00    (2006.01)
(52) U.S. Cl. ............................ 228/103; 228/4.5; 228/8; 228/180.5
(58) Field of Classification Search .................. 228/104
See application file for complete search history.

(56) References Cited

U.S. PATENT DOCUMENTS

| 3,572,108 A | 3/1971 | McShane et al. |
| 3,724,265 A | 4/1973 | LaValle |
| 4,272,007 A | 6/1981 | Steranko |
| 4,373,653 A | 2/1983 | Salzer et al. |
| 4,445,378 A | 5/1984 | Zuckerwar |
| 4,453,414 A | 6/1984 | Ronemus et al. |
| 4,597,519 A | 7/1986 | Kurtz et al. |
| 4,619,397 A | 10/1986 | Urban |

(Continued)

FOREIGN PATENT DOCUMENTS

DE    4447073    7/1996

(Continued)

OTHER PUBLICATIONS

"Bond testing enters mainstream PCB assembly" by Paul Walter, Microelectronics Journal, Mackinstosh Publications LTD. Luton, GB, Bd. 27, Nr. 1, (Feb. 1996).

(Continued)

*Primary Examiner*—Kiley Stoner
(74) *Attorney, Agent, or Firm*—Knobbe Martens Olson & Bear, LLP

(57) ABSTRACT

A method of testing wire-bond connections between a bonding wire and a substrate surface. The wire-bond connections are produced by a bonding head with a bonding tool and a wire clamp associated with the bonding tool under pressure and the action of ultrasound and/or heat. After the bonded connection has been created, the bonding head or the bonding tool is raised a short distance away from the bonding site, the bonding wire is firmly gripped by the wire clamp and the bonding head. The wire clamp with bonding wire gripped therein is raised for a second distance, during which process the tensile force acting on the bonding wire is detected.

11 Claims, 1 Drawing Sheet

U.S. PATENT DOCUMENTS

| | | | |
|---|---|---|---|
| 4,786,860 | A | 11/1988 | Zimmerman |
| 4,815,001 | A | 3/1989 | Uthe et al. |
| 4,854,494 | A | 8/1989 | Von Raben |
| 4,878,609 | A | 11/1989 | Farassat |
| 4,895,028 | A | 1/1990 | Mayer |
| 4,907,458 | A | 3/1990 | Biggs et al. |
| 4,984,730 | A | 1/1991 | Göbel et al. |
| 5,195,237 | A | 3/1993 | Cray et al. |
| 5,213,249 | A | 5/1993 | Long et al. |
| 5,230,458 | A | 7/1993 | Asanasavest |
| 5,275,058 | A | 1/1994 | Pham et al. |
| 5,314,105 | A | 5/1994 | Farassat |
| 5,566,876 | A | 10/1996 | Nishimaki et al. |
| 5,591,920 | A | 1/1997 | Price et al. |
| 5,889,210 | A | 3/1999 | Inoue |
| 5,892,155 | A | 4/1999 | Vanderlip |
| 5,894,981 | A | 4/1999 | Kelly |
| 5,979,737 | A | 11/1999 | Farassat |
| 6,178,823 | B1 | 1/2001 | Sykes |
| 6,301,971 | B1 | 10/2001 | Sykes |
| 6,435,399 | B2 | 8/2002 | Ikoma |
| 6,439,448 | B1 | 8/2002 | Ringler |
| 6,758,385 | B2 | 7/2004 | Farassat |
| 2003/0085255 | A1 | 5/2003 | Farassat |

FOREIGN PATENT DOCUMENTS

| | | |
|---|---|---|
| EP | 0263542 | 12/1989 |
| EP | 0772036 | 5/1997 |
| EP | 0 857 535 | 12/1998 |
| GB | 2270868 | 3/1994 |
| GB | 2271305 | 4/1994 |
| JP | 02-90038 | 3/1990 |
| JP | 2001-118887 | 4/2001 |

OTHER PUBLICATIONS

"An Improved Wire Bond Pull Test" by Shankara Prasad and Ali Saboui, Solid State Technology, Cowan Publ. Corp., Washington, US, Bd. 34, Nr. 6, (Jun. 1991).

"Wire Bond Pull Testing Understanding the Geometric Resolution of Forces" by Gil Perlberg and Cyndy Enman, Advanced Packaging, IHS Publishing Group, US, Bd. 3, Nr. 1, (1994).

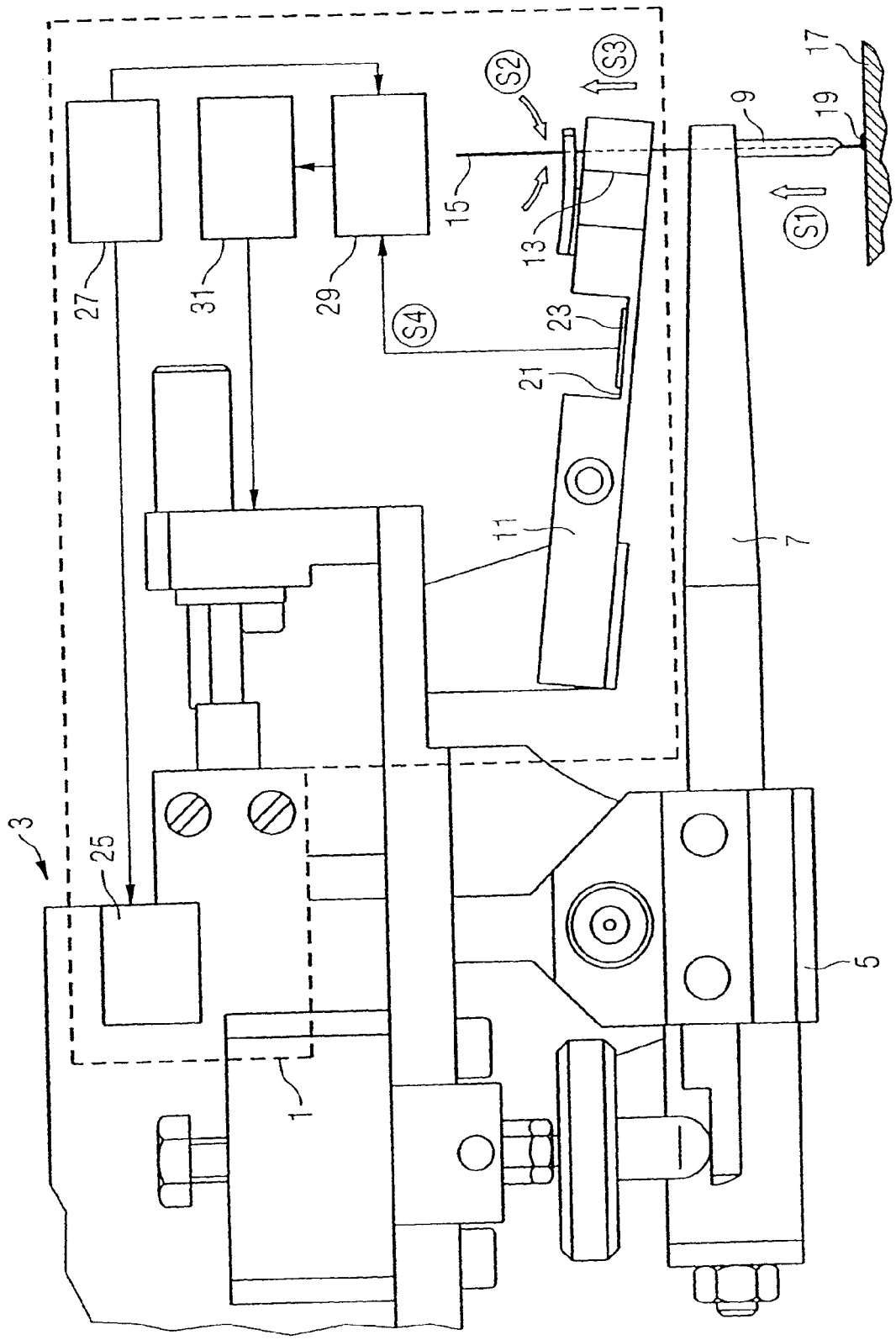

METHOD OF TESTING BONDED CONNECTIONS, AND A WIRE BONDER

CROSS-REFERENCE TO RELATED APPLICATIONS

This application is a continuation of U.S. patent application Ser. No. 10/090,083, filed on Mar. 1, 2002, now abandoned and claims the benefit of the European application number 01 126 621.0, filed on Nov. 7, 2001, both of which are hereby incorporated in their entireties by reference.

BACKGROUND OF THE INVENTION

Field of the Invention

The invention relates to a method of testing bonded connections and to a wire bonder equipped with a corresponding, integrated testing arrangement.

BRIEF DESCRIPTION OF THE DRAWINGS

FIG. 1 illustrates a schematic drawing of one embodiment of a testing arrangement.

DETAILED DESCRIPTION OF THE PREFERRED EMBODIMENT

Wire bonding is a method in which electrical connections of semiconductor components are produced by means of fine metal wires. With wire-bond connections, for example, the contact surfaces of discrete components can be electrically connected to one another, or integrated circuits to contact surfaces on the associated housing or, in the case of hybrid circuits, inserted monolithic elements can be electrically connected to the thick-film circuitry into which they have been inserted.

In the course of the development of technology for connecting semiconductor components and circuits, various bonding methods have been invented and a large number of bonding machines suitable for this purpose have been proposed. The most commonly used wire-bonding methods are ultrasound (U/S) bonding, thermal-compression (T/C) bonding, and thermosound (T/S) bonding. Wire bonders to implement these methods guide a bonding wire to the point (bond pad) provided for the purpose of creating the bonded connection, and then by means of a bonding tool, for instance in the form of a capillary, wedge or nailhead, the wire is deformed and fixed in place by application of a compressive force and the supplementary action of oscillatory and/or thermal energy. In this process, a kind of welded connection is formed between the bonding wire and the bond pad.

The quality of the bonded connection is crucial for the functionality and reliability of the electronic components constructed by employing the bonding method. Therefore it is desirable, if not indispensable, for the parameters of the bonding process to be monitored while the process is under way, as well as for the quality of the finished bonded connection to be tested. Various solutions to the problem of monitoring and regulating essential parameters of the ongoing bonding process—in particular the bonding force and where appropriate also the ultrasound amplitude or energy—have been proposed.

In the patent U.S. Pat. No. 4,854,494 a wire bonder is described that comprises means for monitoring several bonding parameters, especially the bonding force and ultrasound amplitude. This wire bonder has a tool holder with a weakened section, where bowing can occur when the tool is used to press the bonding wire onto the bond pad. By way of a strain gauge disposed in this weakened section, the momentary bonding force is detected and can be kept at a predetermined set point by way of a downstream regulation system.

The patent U.S. Pat. No. 5,230,458 likewise describes a bonding head with a force sensor that measures the compressive force exerted by the bonding tool and signals it to a real-time control circuit. The latter sends an adjustment signal to an actuator that causes a movement in the Z direction, to adjust the bonding force. The bonding machine described here is an ultrasonic bonder of the capillary type, in which the ultrasound transmitter, with capillary attached to serve as bonding tool, is mounted on a carrier frame. This frame also carries an extension arm to guide the bonding wire, which is disposed above another extension arm bearing the ultrasound transmitter.

In the applicant's patent GB 2 270 868A a wire-bonding method and system of a different type is described, namely the ultrasonic (U/S) wedge bonder, in which likewise provision is made for the detection and continuous regulation of bonding force and ultrasonic energy. For this purpose, the deformation of the bonding wire is monitored.

The applicant's patent EP 0 857 535 A1 describes a bonding head with two extension arms, the first of which (tool holder) carries the bonding tool while the second (wire-clamp holder), disposed above the first, carries a wire clamp to grasp a bonding wire and fix it in position. Here, again, the bonder is of the U/S wedge type. The bonding force is adjusted by the action of a linear motor in combination with a pretensioning spring, in response to the signal of a piezo detector disposed at the end of the tool holder.

Moreover, a known method of testing bonded connections is to exert a tensile force with a predetermined value on the attached bonding-wire. If the bonded connection withstands this tensile force, it is judged to be qualitatively perfect. This test is carried out as a procedure following the manufacturing process.

It is the objective of the invention to disclose a method of testing bonded connections that is directly integrated into the manufacturing process, as well as a wire bonder suitable for implementing this method, which enables real-time quality control and the immediate execution of quality-ensuring adjustment procedures while the bonding process is still under way.

This objective is achieved with respect to the method by a testing procedure with the characteristics given in claim 1, and with respect to the apparatus by a wire bonder with the characteristics given in claim 4.

The invention includes the essential idea of exposing a bonded connection to a tensile force immediately after it has been created, and of detecting its response. It further includes the idea that for this purpose the bonding tool and a wire clamp to grip the bonding wire should be moved in a suitable sequence of steps, in combination with a step in which the tensile force is measured, and the idea of disclosing a corresponding arrangement of a tool holder and a wire-clamp holder in combination with a control and evaluation means adapted thereto. An essential characteristic of the execution of the procedure is that the bonding wire is firmly gripped and pulled as soon as the bonded connection has been created (but after the contact between the bonded connection and the bonding tool has been broken), during simultaneous measurement of the tensile force.

In particular, the bonding head or the wire clamp is raised through a second distance calculated in dependence on the structural features, in such a way that during the raising process a predetermined or programmed tensile force is generated and the intactness of the bonded connection is monitored. The latter is achieved by observing the time course of the tensile force acting on the wire clamp during raising. If the bonded connection were to break while the test force is being applied, the result would be a sudden decrease in the measured force, and even slighter anomalies in the time course of the measured tensile force can indicate deficiencies in the quality of the bonded connection and—as the result of an appropriate evaluation—provide a reason to modify the process parameters.

A testing arrangement suitable for implementing the proposed solution comprises, as an essential element, the wire-clamp holder (which is known per se) provided with an associated force-measuring element and a control device to control the movement pattern sketched out above, and represents an integrated component of an improved wire bonder.

In advantageous embodiments of this testing arrangement, the wire-clamp holder is seated on the bonding head in such a way that it can be elastically rotated or linearly displaced against the action of a pretensioning element. A force-measuring element, in particular a strain gauge, is associated with the holder, which also comprises a weakened section in which the tensile force delivered by the drive mechanism causes an elastic deformation (bending, twisting or stretching) of the holder. In particular, the force-measuring element (specifically, the strain gauge) is also disposed there, so as to obtain a force-measurement signal that can be unambiguously evaluated.

So that the testing arrangement can be sensibly integrated into a modern wire bonding machine, the above-mentioned control device is designed as a program control system and permits the testing program to be automatically executed at all or selected bonded connections that are created with the wire bonder.

Other advantages and useful features of the invention will be apparent from the subordinate claims and from the following description of a preferred exemplary embodiment with reference to the figure. This shows, in a schematic drawing, a testing arrangement 1 with essential components of the bonding head 3 of an ultrasonic wire bonder constructed in accordance with the invention. The elementary diagram refers to a bonding head of the kind described in the patent EP a 857 535 A1, the structural details of which are not shown here. In the nature of a synoptic representation, function blocks are added with evaluation and control functions and symbols for the essential procedural steps.

The bonding head 3 comprises a transducer holder 5, in which is mounted an extension arm bearing an ultrasound transducer 7 and, attached thereto, a bonding tool 9 or wedge type), and a wire-clamp holder clamp 13 for the controlled fixation of (e.g., of the capillary 11, which bears a wire a bonding wire 15. On a substrate 17 the bonding head produces, in a manner known per se, a bonded connection 19, the stability of which is to be tested by means of the testing arrangement 1.

The wire-clamp holder 11, in a middle region along its length, has a leaf-spring section 21 as a preferential bending section, in which is attached a strain gauge 23 or similar force sensor that responds to bending deformation.

A drive mechanism 25 (here shown for simplicity as a single block) of the bonding head 3 controls the bonding head or, as separately movable components, the tool holder 5 and the associated extension arm with the transducer 7 as well as the wire-clamp holder 11 and the wire clamp 13, not only in order to move them in the manner known per se to generate the bonded connection 19, but in addition according to a testing program of the kind described above, which is stored in a program memory unit 27. As a result, in particular the following sequence is controlled: a first step S1 in which the bonding tool 9 is lifted slightly away from the bonded connection 19 that has been produced, a second step S2 in which the bonding wire 15 is firmly clamped, a step S3 in which the wire clamp 13 is raised together with the clamped bonding wire 15, and a step 54 in which an initial value signaled by the strain gauge 23 during lifting is detected.

The strain gauge 23 is connected to a tensile-force evaluation unit 29, and its output signal is there evaluated according to a pre-specified algorithm—for example, incorporating a threshold discrimination with respect to a minimal tensile-force value. On the output side the tensile-force evaluation unit 29 is connected to a bonding-parameter control unit 31, in which the result of the evaluation is converted as appropriate into pre-determined changes of the bonding parameters, to ensure the quality of the bonded connection 19.

The embodiment of the invention is not restricted to the example described above, but is also possible in a large number of modifications that are within the competence of a person skilled in the art.

LIST OF REFERENCE NUMERALS

1 Testing arrangement
3 Bonding head
5 Transducer holder
7 Transducer
9 Bonding tool
11 Wire-clamp holder
13 Wire clamp
15 Bonding wire
17 Substrate
19 Bonded connection
21 Leaf-spring section
23 Strain gauge
25 Drive mechanism
27 Program memory unit
29 Tensile-force evaluation unit
31 Bonding-parameter control unit

What is claimed is:

1. A method of testing wire-bond connections, the method comprising:
   forming a wire bond connection between a bond wire and a substrate with a bonding tool according to bonding parameters;
   lifting the bonding tool a lifted distance away from the wire bond connection after the wire bond connection has been created;
   clamping the bonding wire with the bonding tool at the lifted distance;
   lifting the bonding tool and the bond wire through a test distance;
   measuring tensile force exerted on the bonding tool and bond wire during the lifting through the test distance, wherein the measuring step comprises monitoring a sudden decrease in the measured tensile force; and
   modifying the bonding parameters based at least partially on the tensile force measured during the lifting through the test.

2. The method of claim 1, further comprising comparing the tensile force measured during the lifting through the test distance to a minimum tensile force threshold.

3. The method of claim 1, further comprising calculating the test distance so that a predetermined tensile force is exerted as a result of the lifting through the test distance.

4. The method of claim 3, wherein intactness of the wire bond connection is determined by observing a time course of the measured tensile force acting on the bonding tool and bond wire during the lifting through the test distance.

5. A wire bonder comprising:
- a bonding tool;
- a wire clamp for clamping bond wire;
- a drive mechanism for raising and lowering the bonding tool and wire clamp
- a tensile force sensor for testing wire bond connections formed between bond wire and a substrate, wherein the tensile force sensor is engaged with the wire clamp;
- a program control system to control a movement sequence of at least the wire clamp to carry out a measurement of tensile force at the bonding wire; and
- a control unit that evaluates the tensile force measurements and can automatically revise bonding parameters of the wire border.

6. The wire bonder of claim 5, further comprising a wire clamp holder engaged with the drive mechanism and wherein the wire clamp is mounted to the wire clamp holder and wherein the wire clamp holder comprises a preferential bending section such that the wire clamp holder can be elastically deflected during raising and lowering action of the drive mechanism.

7. The wire bonder of claim 6, wherein the tensile force sensor is also attached to the wire clamp holder.

8. The wire bonder of claim 7, wherein the tensile force senor is arranged adjacent the preferential bending section.

9. The wire bonder of claim 6, wherein the program control system induces the wire clamp holder to lift a first distance after a wire bond connection is formed and further induces the wire clamp to grip the bond wire and then induces the wire clamp holder to raise a second distance while the tensile force sensor measures the tensile force acting on the bond wire.

10. The wire bonder of claim 5, wherein the tensile force sensor comprises a strain gauge.

11. The wire bonder of claim 5, wherein the control unit evaluates a time course of the tensile force measurements.
   modifying the bonding parameters based at least partially on the tensile force exerted during the measuring step.

* * * * *